United States Patent
Nie

(10) Patent No.: US 10,802,627 B2
(45) Date of Patent: Oct. 13, 2020

(54) TOUCH PANEL AND MANUFACTURING METHOD THEREOF

(71) Applicant: Wuhan China Star Optoelectronics Technology Co., Ltd., Wuhan, Hubei (CN)

(72) Inventor: Xiaohui Nie, Guangdong (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 16/192,766

(22) Filed: Nov. 15, 2018

(65) Prior Publication Data

US 2019/0302940 A1    Oct. 3, 2019

Related U.S. Application Data

(63) Continuation of application No. PCT/CN2018/111409, filed on Oct. 23, 2018.

(30) Foreign Application Priority Data

Mar. 29, 2018 (CN) .......................... 2018 1 0271541

(51) Int. Cl.
*G06F 3/041* (2006.01)
*H01L 27/12* (2006.01)
*H01L 29/786* (2006.01)
*G06F 3/044* (2006.01)
*H01L 21/285* (2006.01)
(Continued)

(52) U.S. Cl.
CPC ............ *G06F 3/0412* (2013.01); *G06F 3/044* (2013.01); *H01L 27/124* (2013.01); *H01L 27/1218* (2013.01); *H01L 27/1248* (2013.01); *H01L 27/1262* (2013.01); *H01L 29/78633* (2013.01); *G06F 2203/04103* (2013.01); *H01L 21/0217* (2013.01); *H01L 21/02164* (2013.01); *H01L 21/02675* (2013.01); *H01L 21/28568* (2013.01); *H01L 27/1274* (2013.01); *H01L 29/66757* (2013.01); *H01L 29/78675* (2013.01)

(58) Field of Classification Search
USPC ......................................................... 345/174
See application file for complete search history.

(56) References Cited

U.S. PATENT DOCUMENTS

| 10,043,912 B2 | 8/2018 | Chen et al. | |
|---|---|---|---|
| 2017/0154934 A1* | 6/2017 | Kim | ...................... H01L 51/525 |
| 2017/0185181 A1* | 6/2017 | Kim | ...................... G02F 1/1345 |

(Continued)

FOREIGN PATENT DOCUMENTS

| CN | 105514119 A | 4/2016 |
|---|---|---|
| CN | 106910750 A | 6/2017 |
| CN | 108447875 A | 8/2018 |

*Primary Examiner* — Amr A Awad
*Assistant Examiner* — Jonathan G Cooper

(57) ABSTRACT

The disclosure discloses a touch display panel and a manufacturing method thereof. The touch display panel includes: a substrate; a first metal layer including a touch line and a light-shielding block, disposed on the substrate; a TFT function layer disposed on the first metal layer, with the TFT function layer provided with a first via; and a common electrode layer located above the TFT function layer and connected to the touch line through the first via. In the above manner, the present disclosure can reduce the manufacturing cost and improve the process reliability.

4 Claims, 2 Drawing Sheets

(51) Int. Cl.
*H01L 21/02* (2006.01)
*H01L 29/66* (2006.01)

(56) References Cited

U.S. PATENT DOCUMENTS

2017/0222059 A1* 8/2017 Chen ................. H01L 29/78633
2018/0012947 A1* 1/2018 Lee ................... H01L 27/1222

* cited by examiner

TOUCH PANEL AND MANUFACTURING METHOD THEREOF

CROSS REFERENCE TO RELATED APPLICATIONS

The present application is a continuation-application of International (PCT) Patent Application No. PCT/CN2018/111409 filed on Oct. 23, 2018, which claims foreign priority of Chinese Patent Application No. 201810271541.6, filed on Mar. 29, 2018, in the State Intellectual Property Office of China, the entire contents of which are hereby incorporated by reference.

TECHNICAL FIELD

The present disclosure relates to fields of display panels, and in particular, to a touch display panel and a manufacturing method thereof.

BACKGROUND

Low temperature poly-silicon (LTPS) touch panel display usually has a touch control type of a self-inductive capacitance type, by integrating sensor pads on an array substrate to achieve ITP (in cell touch panels), thus improving the quality and value of the product. A structure of the sensor pad generally includes a common ITO and touch line traces. The touch line trace can be fabricated with a separate photomask, that is, the touch line trace is separately configured; or may be fabricated with the photomask of the data line, i.e., the touch line trace can be formed in the same layer or by the same process with the data line, in a synchronous production way with the same metal, but the above two options both have problems of increased costs and process risks.

SUMMARY

A main technical problem to be solved by the present disclosure is to provide a touch display panel and manufacturing methods thereof, so as to reduce production cost, reduce process risks, and improve process reliabilities.

In order to solve the above-mentioned technical problem, a first aspect of the present disclosure provides a touch display panel, including: a substrate; a first metal layer, the first metal layer comprising a touch line and a light-shielding block which are disposed on the substrate; a TFT function layer, the TFT function layer located on the first metal layer, with the TFT function layer provided with a first via, the first via formed in a vertical projection of a part of the light-shielding block; and a common electrode layer, disposed above the TFT function layer of the first metal layer and connected to the touch line through the first via.

In order to solve the above-mentioned technical problem, a second aspect of the present disclosure provides a manufacturing method of a touch display panel, including: disposing a first metal layer on one side of the substrate, the first metal layer including a touch line and a light-shielding block, which are disposed on the substrate; disposing a TFT function layer on the first metal layer, with a first via disposed on the TFT function layer; and disposing a common electrode layer on the TFT function layer, with the common electrode layer connected with the touch line through the first via.

In order to solve the above-mentioned technical problem, a second aspect of the present disclosure provides a manufacturing method of a touch display panel, including: disposing a first metal layer on one side of the substrate, the first metal layer including a touch line and a light-shielding block, which are disposed on the substrate; disposing a TFT function layer on the first metal layer, with a first via disposed on the TFT function layer; and disposing a common electrode layer on the TFT function layer, with the common electrode layer connected with the touch line through the first via.

The first metal layer has the beneficial effects in the present disclosure as follows. Different from the prior art, in the present disclosure, by forming the touch line and the light-shielding block configured for shielding the semiconductor layer from backlight, in the same layer in the first metal layer or in the same process, the common electrode layer can be connected to the touch line through the first via, to realize the touch function of the touch display panel, thereby effectively reducing the cost when manufacturing the touch line, and with the first via provided below the common electrode layer, and the manufacturing process risk is reduced.

DETAILED DESCRIPTION

The technical solution in the embodiments of the present disclosure will be clearly and completely described below with reference to the accompanying drawings in the embodiments of the present disclosure. Obviously, the described embodiments are only a part of the embodiments of the present disclosure, not all of the embodiments. All other embodiments obtained by one with ordinary skills in the art based on the embodiments of the present disclosure without any creative efforts shall fall into the protection scope of the present disclosure.

Figure 1:
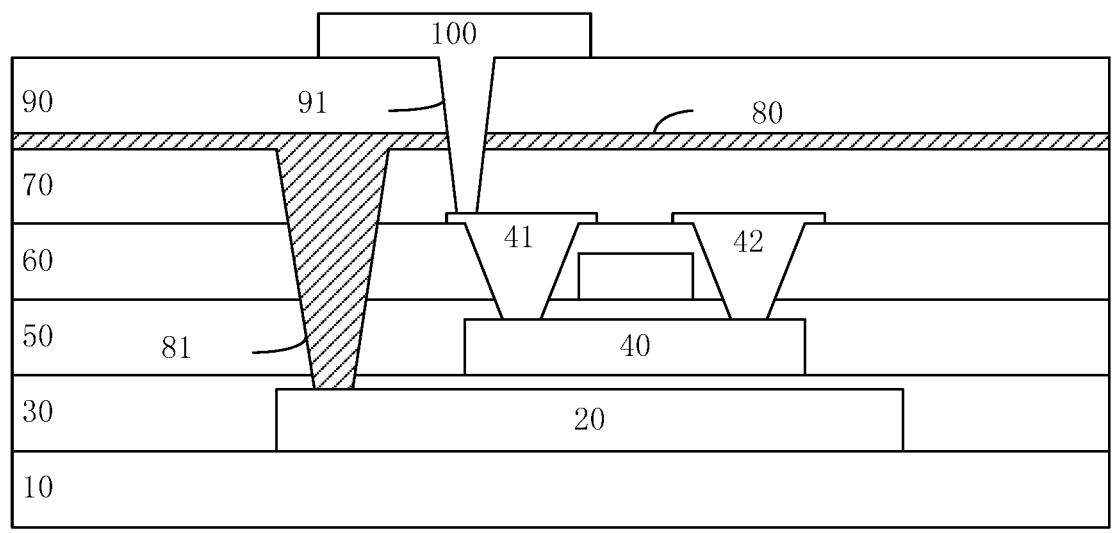
FIG. 1 is a schematic cross-sectional view illustrating an embodiment of a touch display panel provided by the present disclosure.

Referring to FIG. 1, FIG. 1 is a schematic cross-sectional view illustrating a first embodiment of a touch display panel provided by the present disclosure. The touch display panel includes a substrate 10, a first metal layer 20, a buffer layer 30, a gate insulation layer 50, an interlayer insulation layer 60 and a planarization layer 70, a common electrode layer 80, a passivation layer 90, a pixel electrode layer 100, and a drain electrode 41 and source electrode 42. The buffer layer 30, the gate insulation layer 50, the interlayer insulation layer 60, and the planarization layer 70 belong to a TFT function layer. The first metal layer 20 is formed on the substrate 10 in a physical vapor deposition method and made of material of metal Mo (molybdenum). On one side of the substrate 10, the first metal layer 20 is provided, and the buffer layer 30 is coated on one side of the first metal layer 20 away from the substrate 10, the buffer layer 30 having a material composition of SiNx/SiOx. The semiconductor layer 40 is disposed on a side of the buffer layer 30 away from the substrate 10. The semiconductor layer 40 and the first metal layer 20 at least partially overlap in a vertical projection direction, and the material of the semiconductor layer 40 converts from amorphous silicon to polycrystalline silicon by excimer laser annealing. The gate insulation layer 50 is provided on a side of the semiconductor layer 40 away from the substrate 10, with a material composition of SiOx. The interlayer insulation layer 60 is provided on a side of the gate insulation layer 50 away from the substrate 10. The drain electrode 41 and the source electrode 42 are provided on the interlayer insulation layer 60, and the drain electrode 41 and the source electrode 42 are electrically connected to the semiconductor layer 40 through a second via 91 on the interlayer insulation layer 60. The planarization layer 70 is provided on a side of the interlayer insulation layer 60 away from the substrate 10. The passivation layer 90 and the pixel electrode layer 100 are sequentially disposed on a side of the planarization layer 70 away from the substrate 10.

Herein, the common electrode layer 80 is disposed on a side of the planarization layer 70 away from the substrate 10. The buffer layer 30, the gate insulation layer 50, the interlayer insulation layer 60, and the planarization layer 70 are provided with a first via 81 at the same position, so that the common electrode layer 80 is connected to the first metal layer 20 through the first via 81, so as to realize the touch function of the touch display panel. In order that the common electrode layer can smoothly connect the first metal layer 20 through the first via 81, the semiconductor layer 40, and the drain electrode 41 and the source electrode 42 disposed on the semiconductor layer 40, are staggered with the position of the first via. In addition, the second via 91 is further disposed on the interlayer insulation layer 60 for allowing the pixel electrode layer 100 to connect with the drain electrode 41 through the second via 91 to realize the display function of the touch display panel. Since the positions of the semiconductor layer 40 and the source electrode 42 and the drain electrode 41 are all staggered with the first via 81, the second via 91 connecting the drain electrode 41 and the pixel electrode layer 100 is consequently staggered with the position of the first via 81.

Figure 2:
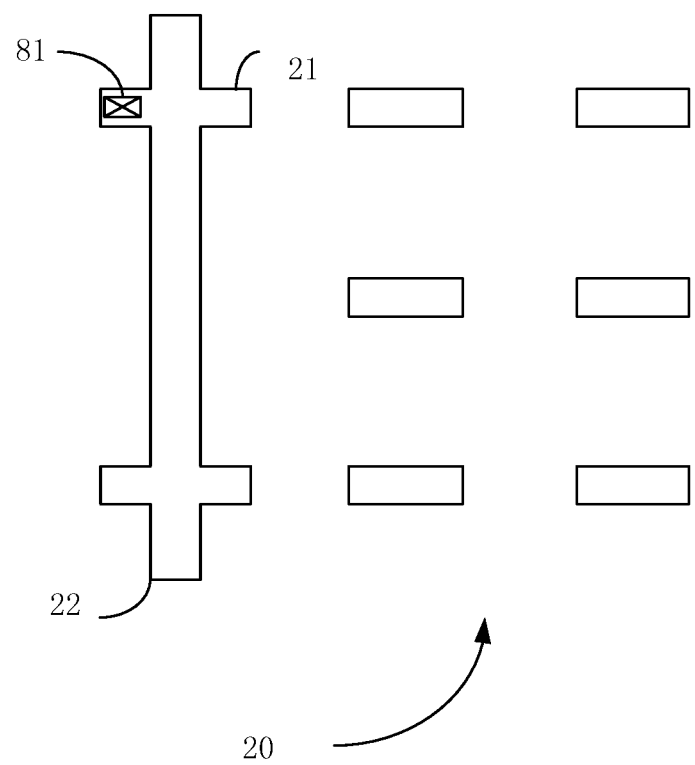
FIG. 2 is a top view illustrating a first metal layer of an embodiment of a touch display panel provided by the present disclosure.
Figure 3:
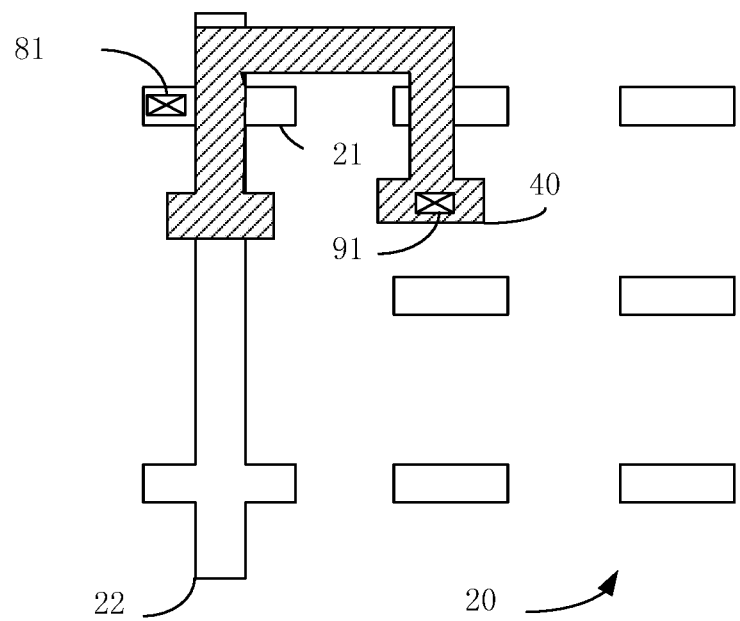
FIG. 3 is a top view illustrating a first metal layer and a semiconductor layer according to an embodiment of the touch display panel provided by the present disclosure.

Referring to FIG. 2, FIG. 2 is a schematic top view of a first metal layer 20 of a second embodiment of the touch display panel provided by the present disclosure. In FIG. 3, it can be seen that in the present embodiment, the first metal layer 20 includes a touch line 22 configured to combine with the common electrode layer 80 to implement a touch function of the panel, and a light-shielding block 21 configured to shield the semiconductor layer 40 from the backlight. The touch line 22 partially overlaps at least one light-shielding block 21. Generally, the main material of the first metal layer 20 is metal Mo (molybdenum). In this embodiment, the touch line 22 and the light-shielding block 21 are made of the same material, and are formed in the first metal layer 20 by the same technique. For example, in the method of physical vapor deposition, the first metal layer 20 including the touch line 22 and the light-shielding block 21 as shown in FIG. 3 is formed on the surface of the substrate 10 at one time only, using metal Mo (molybdenum). In this way, it can be avoided to separately produce the photomask for the touch line 22, and the layout of the light-shielding block 21 and the touch line 22 can be completed at one time, which can save time and production cost, and simplify the manufacturing steps.

In other embodiments, the touch line 22 may be fabricated in the first metal layer 20 together with the light-shielding block 21 with other materials and/or other techniques. For example, a plurality of light-shielding blocks 21 of metal Mo (molybdenum) may be deposited on the substrate 10 in one certain way (for example, physical vapor deposition), and then touch line 22 made of metallic platinum may be disposed on the substrate 10 by another technique. In other embodiments, the materials of the light-shielding block 21 and the touch line 22 may be identical (for example, metal Mo (molybdenum)), but may be sequentially produced in different processes.

Referring to FIG. 3, the first via 81 is located in the vertical projection of the light-shielding block 21. As in this embodiment, the light-shielding block 21 and the touch line 22 in the first metal layer 20 are made of the same material and integrally formed, the light-shielding block 21 and the touch line 22 are electrically connected to each other, and thus when the first via 81 is located in the vertical projection of the light-shielding block 21, the common electrode layer 80 is connected to the light-shielding block 21. Since the light-shielding block 21 and the touch line 22 are electrically connected to each other, it is equivalent that the common electrode layer 80 gets connected to the touch line 22. In other implementation scenarios, even if the light-shielding block 21 and the touch line 22 are not integrally formed, as long as the light-shielding block and the touch line partially overlap each other and connect with each other, the object of the present disclosure may also be achieved.

Referring to FIG. 1 and FIG. 3, FIG. 3 is a top view of the first metal layer 20 and the semiconductor layer 40 of the touch display panel according to a second embodiment of the present disclosure. According to FIG. 2, the first via 81 and the second via 91 are provided on the planarization layer 70. The first via 81 is configured to connect the common electrode layer 80 to the first metal layer 20 to realize the touch function of the touch display panel, the second via 91 is configured to connect the pixel electrode layer 100 and the drain electrode 41 to realize the display function of the touch display screen. The positions of the first via 81 and the second via 91 can be referred to FIG. 3. As shown in FIG. 3, the positions of the first via 81 and the second via 91 are staggered with each other and are not in close proximity to each other, and the first via 81 is farther away from the second via 91 when disposed in the vertical projection of the light-shielding block 21 than the situation of being disposed on the touch line 22. The distance between the first via 81 and the second via 91 can effectively avoid the process risk as long as it is not zero, and the farther the first via 81 is separated from the second via 91, the less the process risk is.

It can be seen from the above description that the touch line and the light-shielding block are disposed in the same layer in the first metal layer, and the first via is connected to the common electrode layer to realize the touch function of the touch display panel, thus simplifying the steps of fabricating touch wires and saving production costs. Because the touch line is connected to a part of light-shielding block in this embodiment, the first via is disposed in the vertical projection region of the part of light-shielding block to enlarge the distance between the first via and the second via which is configured to connect the drain electrode and the pixel electrode, so as to improve the process reliability.

Figure 4:
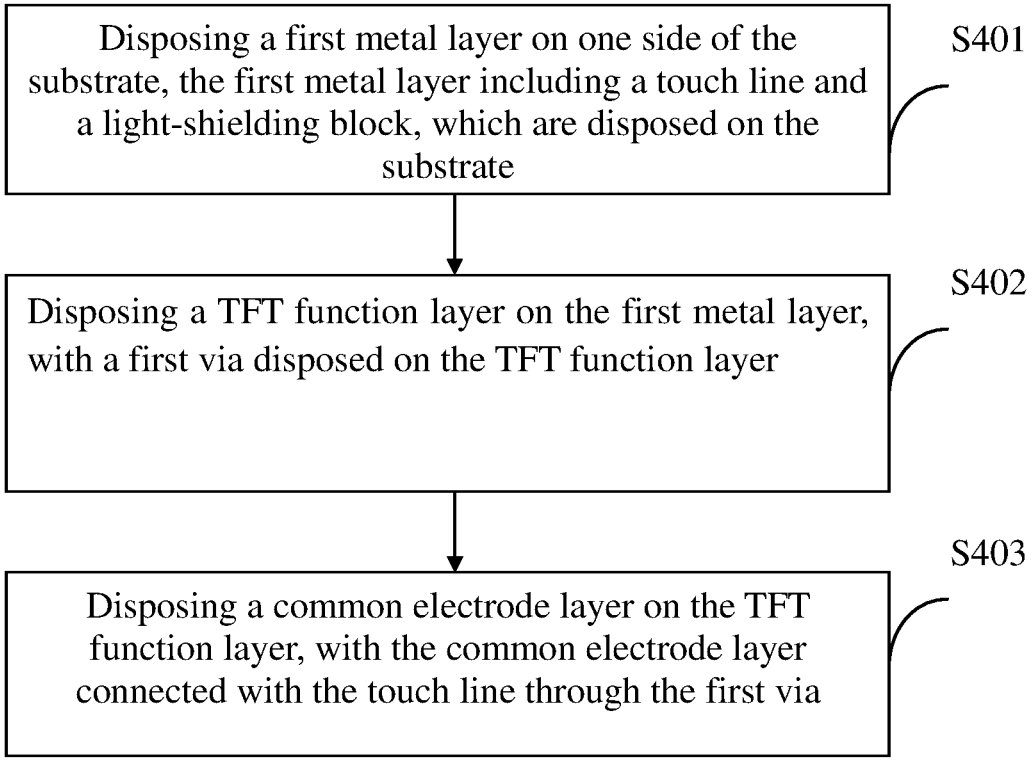
FIG. 4 is a schematic flow chart illustrating an embodiment of a manufacturing method of a touch display panel provided by the present disclosure.

Referring to FIG. 4, FIG. 4 is a schematic flow chart of an embodiment of a manufacturing method of a touch display panel according to the present disclosure. The manufacturing method of the touch display panel provided by the present disclosure includes the following steps.

In S401, the method includes disposing a first metal layer on one side of the substrate, the first metal layer including a touch line and a light-shielding block, which are disposed on the substrate.

In a specific implementation scenario, a first metal layer is disposed on one side of the substrate, and the first metal layer is formed on the substrate in a physical vapor deposition method and made of material of metal Mo (molybdenum), including a light-shielding block configured to shield a semiconductor layer from a backlight, and a touch line, and the touch line overlaps a partial region of a part of light-shielding block. In this implementation scenario, the touch line and the light-shielding block, in the first metal layer, are integrally formed, while in other implementation scenarios, the touch line and the light-shielding block, in the first metal layer, may be made of different materials and may be sequentially formed by different techniques.

In S402, the method includes disposing a TFT function layer on the first metal layer, with a first via disposed on the TFT function layer.

In a specific implementation scenario, the TFT function layer is disposed on the first metal layer, and the TFT function layer includes: a buffer layer, a gate insulation layer, an interlayer insulation layer, and a planarization layer, with a first via disposed in the same position of the buffer layer and the gate insulation layer, the interlayer insulation layer, and the planarization layer.

In this implementation scenario, except for the first metal layer of the touch display panel, other layers are produced in following method. The buffer layer is made by material of SiNx/SiOx, and covers the first metal layer, and after film forming, the first via is to get formed at a preset position. A layer of amorphous silicon is formed on the buffer layer by chemical vapor deposition and is converted into the semiconductor layer by excimer laser annealing. The gate insulation layer is deposited on the semiconductor layer by chemical vapor deposition, with a material composition of SiOx. Similarly, after the gate insulation layer is formed into a film, then an opening is formed at the position of the first via. An layer of the interlayer insulation layer is deposited on the gate insulation layer by chemical vapor deposition, and similarly after the film forming, an opening is formed at the position of the first via. In addition, an additional via is required to be formed on the gate insulation layer, which is located above the semiconductor layer and configured to provide the drain electrode and the source electrode. The drain electrode and the source electrode are produced by physical vapor deposition. After the gate insulation layer is formed into a film, two openings are formed, in which one is a first via, and the other is a second via, and the second via is configured to connect the drain electrode layer and the pixel electrode layer, to realize a display function of the touch display panel. The method also includes manufacturing the planarization layer.

In S403, the method includes disposing a common electrode layer on the TFT function layer, with the common electrode layer connected with the touch line through the first via.

In a specific implementation scenario, a common electrode layer is disposed on a side of the first metal layer away from the substrate, and the common electrode layer is connected to the first metal layer through the first via. In addition, a semiconductor layer is provided on the buffer layer, the position of the semiconductor layer staggered with the position of the first via. A source electrode and a drain electrode are disposed on the semiconductor layer, and positions of the source electrode and the drain electrode are staggered with the position of the first via.

The common electrode layer is formed in a physical vapor deposition method and is connected to the first metal layer through the first via. Since the positions of the semiconductor layer and the source electrode as well as drain electrode are all staggered with the first via, the second via connecting the drain electrode and the pixel electrode layer is consequently staggered with the position of the first via.

In the present embodiment, the first via is located in a vertical projection region of a part of the light-shielding block. In this embodiment, as the light-shielding block and the touch line, in the first metal layer, are integrally formed and made of the same material, the light-shielding block and the touch line are electrically connected to each other, and thus when the first via is located in the vertical projection of the light-shielding block, the common electrode layer is connected to the light-shielding block. Since the light-shielding block and the touch line are electrically connected to each other, it is equivalent that the common electrode layer is connected to the touch line. The first via is farther away from the second via when disposed in the vertical projection of the light-shielding block than when disposed on the touch line. The farther the first via is separated from the second via, the less the process risk is.

It can be seen from the above description that the touch line and the light-shielding block are disposed in the same layer in the first metal layer, and the first via is connected to the common electrode layer to realize the touch function of the touch display panel, thus simplifying the steps of fabricating touch wires and saving production costs. Since the first via is disposed in the vertical projection region of the part of light-shielding block, it is possible to enlarge the distance between the first via and the second via which is configured to connect the drain electrode and the pixel electrode, thereby reducing the risk of the process.

Different from the prior art, the common electrode of the present disclosure connects the touch line located in the first metal layer through the first via, and the touch line and the light-shielding block are disposed in the same layer in the first metal layer or produced in the same process, thus reducing the steps and costs of producing the touch line, simplifying the steps and further facilitating reducing the risk of the process. In addition, since the touch line and the light-shielding block partially overlap in the present disclosure, the first via can be disposed in the vertical projection of the part of light-shielding block, so that the common electrode layer is connected to the touch layer through the light-shielding block, to realize the touch function. In this way, the position of the first via is farther away from other vias that need to be formed, further reducing the process risk.

The above description merely illustrates some exemplary embodiments of the disclosure, which however are not intended to limit the scope of the disclosure to these specific embodiments. Any equivalent structural or flow modifications or transformations made to the disclosure, or any direct or indirect applications of the disclosure on any other related fields, shall all fall in the scope of the disclosure.

What is claimed is:
1. A touch display panel, comprising:
a substrate;
a first metal layer, the first metal layer comprising a touch line and a light-shielding block which are disposed on the substrate;
a TFT function layer, the TFT function layer located on the first metal layer, with the TFT function layer provided with a first via, the first via formed in a vertical projection of a part of the light-shielding block while not being disposed in a vertical projection of the touch line; and a common electrode layer, disposed above the TFT function layer of the first metal layer and connected to the touch line through the first via;

wherein, the TFT function layer comprises: a buffer layer, a gate insulation layer, an interlayer insulation layer, and a planarization layer, sequentially disposed between the first metal layer and the common electrode layer, with the first via provided at a same position of the buffer layer, the gate insulation layer, the interlayer insulation layer and the planarization layer, so as to connect the common electrode layer to the touch line;

wherein, the panel further comprises: a semiconductor layer disposed on the buffer layer, with a position of the semiconductor layer staggered with a position of the first via; a source electrode and a drain electrode disposed on the semiconductor layer, with positions of the source electrode and the drain electrode staggered with the position of the first via;

wherein, the panel further comprises a pixel electrode layer; a second via is disposed on the interlayer insulation layer to connect the drain electrode with the pixel electrode layer;

wherein the semiconductor layer includes a first overlapping section, a second overlapping section, and a connecting section; the first overlapping section is parallel to the second overlapping section, the connecting section is perpendicular to the first overlapping section and the second overlapping section and connects the first overlapping section with the second overlapping section; the first overlapping section and the touch line partially overlap in a vertical projection direction, and the second via is disposed in a vertical projection of the second overlapping section.

2. The panel according to claim 1, further comprising a passivation layer; wherein, the passivation layer is disposed on the common electrode layer, the pixel electrode layer is disposed on the passivation layer, and the second via runs through the planarization layer, the common electrode layer, and the passivation layer.

3. A touch display panel, comprising:
a substrate;
a first metal layer, the first metal layer comprising a touch line and a light-shielding block which are disposed on the substrate; wherein the touch line and the part of the light-shielding block are integrally formed;
a TFT function layer, the TFT function layer located on the first metal layer, with the TFT function layer provided with a first via, wherein the first via is formed in a vertical projection of a part of the light-shielding block while not disposed in a vertical projection of the touch line; and
a common electrode layer, disposed above the TFT function layer of the first metal layer and connected to the touch line through the first via;

wherein, the TFT function layer comprises: a buffer layer, a gate insulation layer, an interlayer insulation layer, and a planarization layer, sequentially disposed between the first metal layer and the common electrode layer, with the first via provided at a same position of the buffer layer, the gate insulation layer, the interlayer insulation layer and the planarization layer, so as to connect the common electrode layer to the touch line;

wherein, the panel further comprises: a semiconductor layer disposed on the buffer layer, with a position of the semiconductor layer staggered with a position of the first via; a source electrode and a drain electrode disposed on the semiconductor layer, with positions of the source electrode and the drain electrode staggered with the position of the first via;

wherein, the panel further comprises a pixel electrode layer; a second via is disposed on the interlayer insulation layer to connect the drain electrode with the pixel electrode layer;

wherein, the semiconductor layer includes a first overlapping section, a second overlapping section, and a connecting section; the first overlapping section is parallel to the second overlapping section, the connecting section is perpendicular to the first overlapping section and the second overlapping section and connects the first overlapping section with the second overlapping section; the first overlapping section and the touch line partially overlap in a vertical projection direction, and the second via is disposed in a vertical projection of the second overlapping section.

4. The panel according to claim 3, further comprising a passivation layer; wherein, the passivation layer is disposed on the common electrode layer, the pixel electrode layer is disposed on the passivation layer, and the second via runs through the planarization layer, the common electrode layer, and the passivation layer.

* * * * *